United States Patent
Saitoh

(10) Patent No.: US 9,577,113 B2
(45) Date of Patent: Feb. 21, 2017

(54) SEMICONDUCTOR DEVICE AND METHOD FOR MANUFACTURING SAME

(71) Applicant: Sharp Kabushiki Kaisha, Osaka (JP)

(72) Inventor: Yuhichi Saitoh, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 15/230,300

(22) Filed: Aug. 5, 2016

(65) Prior Publication Data

US 2016/0343869 A1    Nov. 24, 2016

Related U.S. Application Data

(62) Division of application No. 14/373,620, filed as application No. PCT/JP2013/051147 on Jan. 22, 2013, now Pat. No. 9,437,745.

(30) Foreign Application Priority Data

Jan. 26, 2012  (JP) .................... 2012-014467

(51) Int. Cl.
- H01L 29/78 (2006.01)
- H01L 29/786 (2006.01)
- H01L 27/12 (2006.01)
- H01L 29/417 (2006.01)
- H01L 29/423 (2006.01)

(52) U.S. Cl.
CPC ......... *H01L 29/7869* (2013.01); *H01L 27/124* (2013.01); *H01L 27/1225* (2013.01); *H01L 29/41733* (2013.01); *H01L 29/42384* (2013.01)

(58) Field of Classification Search
CPC .................................................. H01L 29/7869
See application file for complete search history.

(56) References Cited

U.S. PATENT DOCUMENTS

| | | |
|---|---|---|
| 5,846,855 A | 12/1998 | Igarashi et al. |
| 2010/0051936 A1 | 3/2010 | Hayashi et al. |
| 2011/0031492 A1 | 2/2011 | Yamazaki et al. |

FOREIGN PATENT DOCUMENTS

| | | |
|---|---|---|
| JP | 7-221308 A | 8/1995 |
| JP | 9-307114 A | 11/1997 |
| JP | 2008-166716 A | 7/2008 |
| JP | 2011-54949 A | 3/2011 |
| JP | 2011-100951 A | 5/2011 |
| JP | 2011-249674 A | 12/2011 |

*Primary Examiner* — Fernando L Toledo
*Assistant Examiner* — Valerie N Newton
(74) *Attorney, Agent, or Firm* — Chen Yoshimura LLP

(57) ABSTRACT

A semiconductor device includes a substrate; a gate electrode provided on the substrate; a first insulating layer formed on the gate electrode; an island-shaped oxide semiconductor layer formed on the first insulating layer; a source electrode electrically connected to the oxide semiconductor layer; and a drain electrode electrically connected to the oxide semiconductor layer, wherein the first insulating layer has a recess in the surface, wherein the oxide semiconductor layer is formed on a bottom surface and side walls of said recess and on an upper face of the first insulating layer, and wherein at least one of the source electrode and the drain electrode is disposed on a portion of the oxide semiconductor layer over the side walls of said recess, and is not formed on a portion of the oxide semiconductor layer over the upper face of the first insulating layer.

4 Claims, 15 Drawing Sheets

SEMICONDUCTOR DEVICE AND METHOD FOR MANUFACTURING SAME

TECHNICAL FIELD

The present invention relates to a semiconductor device provided with a thin-film transistor and a method of manufacturing the same.

BACKGROUND ART

An active matrix substrate used in liquid crystal display devices and the like has a switching element such as a thin-film transistor (hereinafter, "TFT") in each pixel. Conventionally, a TFT having an amorphous silicon layer or a polycrystalline silicon layer as an active layer has been widely used as such a switching element.

There have been recent attempts to achieve a higher performing TFT while suppressing the number of manufacturing steps and cost by using an oxide semiconductor such as zinc oxide as a material for a TFT active layer (Patent Document 1 and Patent Document 2, for example). A TFT that uses an oxide semiconductor is referred to as an "oxide semiconductor TFT." Oxide semiconductors have a higher mobility than amorphous silicon. Therefore, the oxide semiconductor TFT can operate at a faster speed than the amorphous silicon TFT. Furthermore, the oxide semiconductor film is formed with a process that is simpler than for the polycrystalline silicon film, and thus, the oxide semiconductor film can be applied to devices requiring a large area.

However, with an oxide semiconductor film, there is a risk that oxygen defects will create electron carriers in the TFT manufacturing process, such as in a heat treatment step and the like, causing a reduced resistance. Furthermore, in bottom-gate TFTs, the oxide semiconductor film at the bottom thereof is susceptible to damage during the step of etching the source and drain electrodes and the step of forming the interlayer insulating film. Thus, there have been problems such as the hysteresis of the TFT characteristics increasing, and stable TFT characteristics being difficult to achieve when using an oxide semiconductor film as an active layer of the TFT.

As a countermeasure, in Patent Document 1, for example, forming an insulating film (channel protective film) that functions as an etching stopper on the channel region of an active layer made of an oxide semiconductor has been proposed.

FIG. 14A is a plan view for describing a conventional oxide semiconductor TFT that has a channel protective film. FIG. 14B is a cross-sectional view of FIG. 14A along the line A-A'.

The oxide semiconductor TFT includes: a substrate 1, a gate 3 provided on the substrate 1, a gate insulating layer 5 covering the gate 3, an oxide semiconductor layer 7 formed on the gate insulating layer 5, a channel protective layer (hereinafter, simply "protective layer") 9 formed on the oxide semiconductor layer 7, and a source electrode 11 and a drain electrode 13 that are provided on the oxide semiconductor layer 7. The source electrode 11 and the drain electrode 13 are respectively electrically connected to the oxide semiconductor layer 7. Patent Document 1 discloses the usage of an amorphous oxide insulator as a protective layer 9.

In the process of manufacturing an oxide semiconductor TFT in Patent Document 1, when patterning is performed for the source electrode 11 and the drain electrode 13, the channel region of the oxide semiconductor layer 7 is protected by the protective layer 9. Thus, damage to the channel region of the oxide semiconductor layer 7 can be suppressed.

Furthermore, a process to continuously form an oxide semiconductor layer and a protective layer without exposing them to air is disclosed in Patent Document 2. For example, in FIG. 5 of Patent Document 2, a method of etching an oxide semiconductor layer and protective layer using the same mask has been proposed. A TFT with the same configuration as FIG. 5 of Patent Document 2 is shown in FIG. 15. In FIG. 15, the same reference characters as FIG. 14 are used for the same constituting elements.

RELATED ART DOCUMENTS

Patent Documents

Patent Document 1: Japanese Patent Application Laid-Open Publication No. 2008-166716
Patent Document 2: Japanese Patent Application Laid-Open Publication No. 2011-249674

SUMMARY OF THE INVENTION

Problems to be Solved by the Invention

However, the inventor of the present invention has conducted various studies indicating that the stability of the process is high and the damage to the oxide semiconductor layer 7 by processes such as source/drain separation process is further suppressed for a TFT (etching stopper type TFT, hereinafter "ES type TFT") provided with a protective layer 9 on the channel as shown in FIG. 14 and FIG. 15, than for a TFT (channel etching type TFT, hereinafter, "CE type TFT") without a protective layer 9.

However, the channel length L of conventional ES type TFT, becomes larger than for CE type TFTs due to limits of the process. In CE type TFTs, for example, the minimum value of the channel length L is the minimum value (for example, 3 μm) of the etching width, which depends on the precision by which the photoresist is formed. By contrast, in the ES type TFTs shown in FIG. 14 and FIG. 15, for example, the minimum value of the distance G between the source and the drain is set by the minimum value of the above mentioned etching width (approximately 3 μm), but since it is necessary to consider the alignment accuracy between the source/drain and semiconductor layer, it is necessary to make the minimum value of channel length L larger than distance G. The minimum value of the channel length L would also depend on the alignment accuracy, but could be 5 μm, for example. Thus, there is a risk that the capacitance between the gate/drain (parasitic capacitance) Cgd increases compared to CE type TFT.

In this manner, if a conventional ES type TFT is to be used as a pixel TFT for a liquid crystal display device, because the parasitic capacitance (Cgd) of TFT increases, there is a risk that the display quality decreases due to the increased pull-in voltage. Furthermore, if a conventional ES type TFT is used for a driver circuit of a display device, there are risks such as the circuit size and power consumption increasing.

An embodiment of the present invention was made to solve the above-mentioned problems, and a main object thereof is to reduce process damage to the channel, make the channel length L small, and provide a semiconductor device with oxide semiconductor TFTs by which it is possible to decrease the parasitic capacitance in the TFTs.

Means for Solving the Problems

A semiconductor device of an embodiment of the present invention includes: a substrate; a gate electrode provided on the substrate; a first insulating layer formed on the gate electrode; an island-shaped oxide semiconductor layer formed on the first insulating layer; a source electrode electrically connected to the oxide semiconductor layer; a drain electrode electrically connected to the oxide semiconductor layer; and a protective layer covering an upper face of the oxide semiconductor layer, wherein at least one of the source electrode and the drain electrode is disposed on a portion of a side face of the oxide semiconductor layer and on a portion of a side face of the protective layer, and does not cover an upper face of the protective layer.

In an embodiment, an upper edge face of at least one of the source and drain electrodes is flush with the upper face of the protective layer.

In an embodiment, at least one of the source electrode and the drain electrode is in contact with the oxide semiconductor layer only at the side face of the oxide semiconductor layer.

In an embodiment, a portion of the side face of the oxide semiconductor layer is flush with a portion of the side face of the protective layer.

In an embodiment, the side faces of the oxide semiconductor layer include a first side face that has a first taper angle and a second side face that has a second taper angle which is smaller than the first taper angle, and at least one of the source electrode and the drain electrode is formed on the first side face of the oxide semiconductor layer but is not formed on the second side face.

In another embodiment, the present invention includes: a substrate; a gate electrode provided on the substrate; a first insulating layer formed on the gate electrode; an island-shaped oxide semiconductor layer formed on the first insulating layer; a source electrode electrically connected to the oxide semiconductor layer; and a drain electrode electrically connected to the oxide semiconductor layer, wherein the first insulating layer has a recess on the surface, wherein the oxide semiconductor layer is formed on the bottom face and side walls of said recess and on an upper face of the first insulating layer, and wherein at least one of the source electrode and the drain electrode is disposed on a portion of the oxide semiconductor layer over the side walls of the recess, and is not formed on a portion of the oxide semiconductor layer over the upper face of the insulating layer.

In an embodiment, the present invention further includes: a lower wiring layer formed of the same conductive film as the gate electrode; an upper wiring layer formed of the same conductive film as the source electrode, the upper wiring layer intersecting with the lower wiring layer across the first insulating layer to form a wiring cross portion; and an island-shaped second insulating layer formed of the same insulating film as the protective layer, wherein the upper wiring layer includes a first wiring line formed on the upper face of the first insulating layer, and a second wiring line disposed on the wiring cross portion and formed on the side walls of the second insulating layer, and wherein the upper wiring layer is not formed on the second insulating layer at the wiring cross portion.

In an embodiment, the present invention includes: a lower wiring layer formed on a substrate; a lower insulating layer formed on the lower wiring layer; an upper wiring layer formed on the lower insulating layer, the upper wiring layer intersecting with the lower wiring layer across the lower insulating layer to form a wiring cross portion; and an island-shaped upper insulating layer formed on the lower insulating layer so as to be in contact with the upper wiring layer, wherein the upper wiring layer includes a first portion formed on the upper face of the lower insulating layer and a second portion disposed on the wiring cross portion and formed on a side wall of the upper insulating layer, and wherein the upper wiring layer is not formed on the upper face of the upper insulating layer at the wiring cross portion.

In an embodiment of the present invention, the upper edge of the second portion of the upper wiring layer is flush with the upper face of the upper insulating layer.

In an embodiment of the present invention, the first portion and the second portion of the upper wiring layer are connected.

In an embodiment, the present invention further includes, in the wiring cross portion, an oxide semiconductor layer formed between the lower insulating layer and upper insulating layer, wherein the second portion is at least in contact with a portion of a side face of the oxide semiconductor layer, and functions as a source electrode or drain electrode.

In an embodiment of the present invention, the oxide semiconductor layer includes an In—Ga—Zn—O semiconductor.

A method of manufacturing a semiconductor device of an embodiment of the present invention includes: (A) forming a gate electrode on a substrate; (B) forming a gate insulating layer so as to cover the gate electrode; (C) forming an oxide semiconductor film on the gate insulating layer; (D) forming a protective film on the oxide semiconductor film; (E) forming an island-shaped oxide semiconductor layer and an island-shaped protective layer by simultaneously patterning the oxide semiconductor film and the protective film; (F) forming a conductive film so as to cover the oxide semiconductor layer and the protective layer; and (G) forming at least any one of a source electrode and drain electrode on the side faces of the oxide semiconductor layer and protective layer by performing anisotropic etching on the conductive film.

In an embodiment of the present invention, the step (G) includes a step of forming a side wall conductive film by aforementioned anisotropic etching that covers the side walls of the oxide semiconductor layer and the protective layer, and then by removing a portion of the side walls of the conductive film, separate the conductive film on the side walls to the source electrode and the drain electrode.

In an embodiment of the present invention, the step (E) includes a step performing patterning of the oxide semiconductor film and protective film in a manner that the side faces of the oxide semiconductor layer includes a first side face that has a first taper angle and a second side face that has a second taper angle smaller than the first taper angle, and the step (G) removes a portion disposed on the second side face of the oxide semiconductor layer of the conductive film by the anisotropic etching, and the portion disposed on the first side face remains and becomes the source electrode and the drain electrode.

A method of manufacturing a semiconductor device of another embodiment of the present invention includes: (a) forming a gate electrode on a substrate; (b) forming a gate insulating layer that has a recess on the surface so as to cover the gate electrode; (c) forming an island-shaped oxide semiconductor layer within the recess portion of the gate insulating layer and on the gate insulating layer so as to cover the bottom face and the side walls of the recess; (d) forming a conductive film so as to cover the oxide semiconductor layer; and (e) forming at least one of a source electrode and drain electrode on a portion disposed on the side walls of the recess of the oxide semiconductor layer by performing anisotropic etching to the conductive film.

A method of manufacturing a semiconductor device of yet another embodiment of the present invention includes: (A) forming a lower wiring layer on a substrate; (B) forming a lower insulating layer so as to cover the lower wiring layer; (C) forming an island-shaped upper insulating layer on the lower insulating layer, and when seen from a direction normal to the substrate, at least a portion of the upper insulating layer is disposed as to overlap with the lower wiring layer; (D) forming a conductive film so as to cover the upper face and the side faces of the upper insulating layer, and the lower insulating layer; and (E) forming an upper wiring layer including a portion disposed on the side faces of the upper insulating layer by performing anisotropic etching to the conductive film, wherein the portion disposed on the side faces of the upper wiring layer overlaps with the lower wiring layer through the lower insulating layer.

In an embodiment, the oxide semiconductor film includes an In—Ga—Zn—O semiconductor.

Effects of the Invention

According to an embodiment of the present invention, a semiconductor device provided with an oxide semiconductor TFT includes a protective layer that protects the channel, and thus, the process damage to a channel can be suppressed. Furthermore, as the source and drain electrodes are disposed on the side faces of an oxide semiconductor layer and a protective layer and are not disposed on the upper face of the protective layer, the channel length L can be reduced, and the parasitic capacitance (the capacitance between the gate/drain Cgd, and/or capacitance between the source/drain Cgs) can be reduced.

Also, according to a method of manufacturing a semiconductor device for an embodiment of the present invention, the semiconductor device can be manufactured without increasing the number of manufacturing steps significantly.

BRIEF DESCRIPTION OF THE DRAWINGS

FIG. 1A is a plan view, and FIG. 1B is a cross-sectional view of FIG. 1A along the line A-A'.

FIG. 9A is a plan view, and FIG. 9B is a cross-sectional view of FIG. 9A along the line A-A'.

FIG. 12A is a plan view, and FIG. 12B is a cross-sectional view of FIG. 12A along the line B-B'.

FIG. 13 is a drawing for explaining the effects of Embodiment 4 in the present invention;

FIG. 14A is a plan view, and FIG. 14B is a cross-sectional view of FIG. 14A along the line A-A'.

DETAILED DESCRIPTION OF EMBODIMENTS

Embodiment 1

Below, Embodiment 1 of a semiconductor device of the present invention will be explained with reference to figures. The semiconductor device of the present embodiment is provided with a thin-film transistor (oxide semiconductor TFT) that has an active layer made of an oxide semiconductor. The semiconductor device of the present embodiment only needs to include at least one oxide semiconductor TFT, and includes a wide range of substrates provided with such TFT, active matrix substrates, various types of display devices, electronic devices, and the like.

Figure 1A:
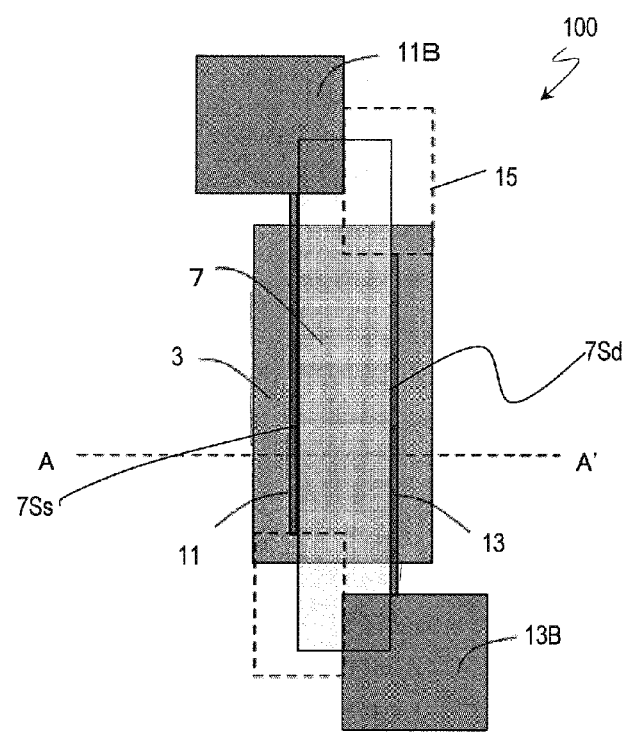
FIGS. 1A and 1B are drawings that schematically show thin-film transistors of the semiconductor device in Embodiment 1 of the present invention.
Figure 1B:
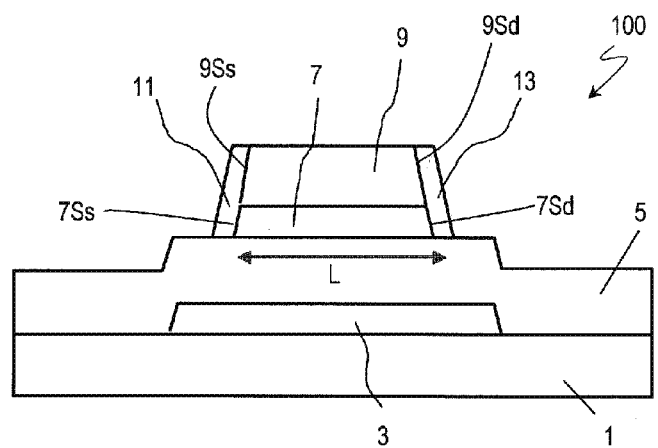

FIG. 1 is a drawing that schematically shows a thin-film transistor 100 in the present embodiment. FIG. 1A is a plan view of a thin-film transistor 100, and FIG. 1B is a cross-sectional view of FIG. 1A along the line A-A'.

A thin-film transistor 100 includes: a substrate 1, a gate 3 provided on the substrate 1, a gate insulating layer 5 covering the gate 3, an oxide semiconductor layer 7 formed on the gate insulating layer 5, a protective layer (also called channel protective layer or etching stopper layer) 9, and a source electrode 11 and a drain electrode 13 that are electrically connected to the oxide semiconductor layer 7 and that are provided on the oxide semiconductor layer 7. A protective layer 9 covers the top face of an oxide semiconductor layer 7.

The source electrode 11 and drain electrode 13 are in contact with oxide semiconductor layer 7 at the side faces of the oxide semiconductor layer 7. In the example shown, the source electrode 11 is disposed on the side face 7Ss of the source side of the oxide semiconductor layer 7 and on the side face 9Ss of the source side of the protective layer 9. The drain electrode 13 is disposed on the side face 7Sd of the drain side of the oxide semiconductor layer 7 and on the side face 9Sd of the drain side of the protective layer 9. Furthermore, the source electrode 11 and drain electrode 13 are not formed on the top face of the protective layer 9.

It is preferable that the side face 7Ss of the oxide semiconductor layer 7 and the side face 9Ss of the protective layer 9 be flush, and that the side face 7Sd of the oxide semiconductor layer 7 and the side face 9Sd of the protective layer 9 be flush. Having "the side faces be flush" for two or more layers, refers not only to cases in which layers have one continuous surface in the vertical direction, but also includes cases in which the faces of these layers form a continuous inclined surface such as a tapered shape. This kind of configuration can be obtained by etching and the like of these layers using the same mask, for example.

The source electrode 11 and drain electrode 13 in this embodiment are formed so as to be self-aligned in the following manner, for example. First, a conductive film for forming an electrode is formed so as to cover the protective layer 9 and oxide semiconductor layer 7. Then, anisotropic etching that involves dry etching or the like is performed. As a result, in addition to the portion of the conductive film that is covered by a mask or the like, the portion that is arranged on the side faces of the protective layer 9 and the oxide semiconductor layer 7 also remains. Next, after forming the resist mask, the portion arranged within the broken line as shown in FIG. 1A is removed from the conductive film (an opening is formed). By doing so, a source electrode 11 and a drain electrode 13 that are separated from each other can be obtained. With this method, the upper edge face (upper face) of the source electrode 11 and the drain electrode 13 and the upper face of the protective layer 9 become one continuous surface.

The source electrode 11 and the drain electrode 13 only need to be in contact, respectively, with portions of the side faces 7Ss and 7Sd that are in a channel length direction of the oxide semiconductor layer 7 with respect to each other. The source electrode 11 and the drain electrode 13 can be electrically connected with a source connecting member 11B and a drain connecting member 13B. In this example, the source electrode 11 and the source connecting member 11B are formed integrally using the same conductive film. In other words, the source electrode 11 and source connecting member 11B are included in one continuous pattern. Similarly, the drain electrode 13 and the drain connecting member 13B are formed integrally using the same conductive film. The source connecting member 11B and the drain connecting member 13B may be wiring lines (a portion of wiring lines). For example, the source connecting member 11B may be a portion of a source bus line, or a conductive portion that branches from the source bus line.

In the present embodiment, the source electrode 11 and drain electrode 13 are in contact with oxide semiconductor layer 7 at the side faces of the oxide semiconductor layer 7. Thus, because the entire width of the oxide semiconductor layer 7 can be used as a channel, the channel length L can be reduced compared to a conventional configuration (for example, FIG. 15).

Figure 15:
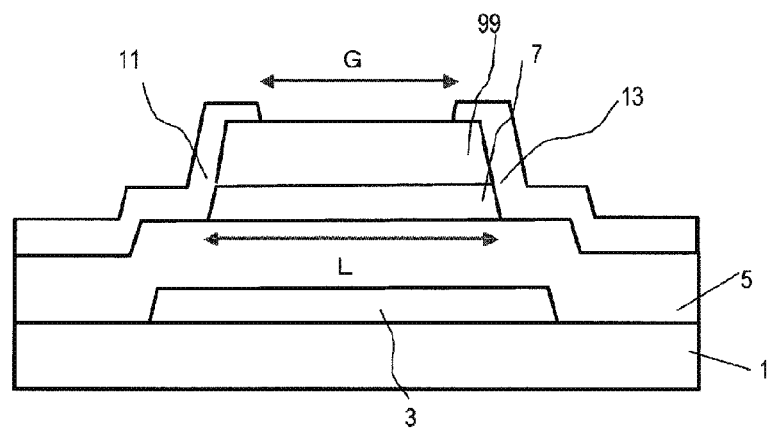
FIG. 15 is a cross-sectional view that schematically shows a conventional oxide semiconductor TFT.

Specifically, in the conventional configuration shown in FIG. 15, for example, the gap (etching width) G between the source electrode 11 and the drain electrode 13 is determined by taking into consideration the precision with which the photoresist is formed. Therefore, the width (channel length L) of the oxide semiconductor layer 7 becomes greater than the gap G. By contrast, in the present embodiment, it is possible to reduce the width (channel length L) of the oxide semiconductor layer 7 to the minimum width determined by the precision with which the photoresist is form. Thus, it is possible to protect the channel from process damage with the protective layer 9 and also reduce the channel length L to a similar level as the channel length of a CE type TFT.

An oxide semiconductor layer 7 includes In—Ga—Zn—O semiconductors (hereinafter, abbreviated as "IGZO semiconductor"), for example. Here, an IGZO semiconductor is a ternary oxide including In (indium), Ga (gallium), and Zn (zinc), and there is no special limitation to the ratio (composition ratio) of In, Ga, and Zn, which includes In:Ga:Zn=2:2:1, In:Ga:Zn=1:1:1, and In:Ga:Zn=1:1:2 and the like, for example. For TFTs that use IGZO semiconductors, the problem that desired characteristics (threshold voltage and the like) cannot be achieved due to oxygen loss caused by process damage is especially pronounced, and therefore, better results can be achieved by applying the configuration in the present embodiment. IGZO semiconductors may be amorphous or crystalline. It is preferable that a crystalline IGZO semiconductor have a c-axis with an orientation that is mostly vertical to the layer face. Such a crystal structure of an IGZO semiconductor is disclosed, for example, in Japanese Patent Application Laid-Open Publication No. 2012-134475. All the content disclosed in Japanese Patent Application Laid-Open Publication No. 2012-134475 is incorporated by reference in the present specification. Oxide semiconductor materials that form the oxide semiconductor layer 7 are not limited to IGZO semiconductors, and for example, can also be Zn—O semiconductors (ZnO), In—Zn—O semiconductors (IZO), Zn—Ti—O semiconductors (ZTO), Cd—Ge—O semiconductors, Cd—Pb—O semiconductors, In—Sn—Zn—O semiconductors ($In_2O_3$—$SnO_2$—ZnO, for example), and In—Ga—Sn—O semiconductors.

It is preferable that the thickness of an oxide semiconductor layer 7 be greater than or equal to 30 nm and less than or equal to 300 nm. If the thickness is greater than or equal to 30 nm, then enough contact area between the oxide semiconductor layer 7 and the source electrode 11 and the drain electrode 13 can be ensured, and thus, the increase in contact resistance can be suppressed. If the thickness is less than or equal to 300 nm, the increase in TFT size can be suppressed. The thickness of each film and layer, unless otherwise indicated, is not the thickness of a side face of a pattern film, but the thickness of a film formed on a flat surface. However, the thickness of the source and drain electrode 11 and 13 respectively indicate the lengths of electrodes 11 and 13 from the side faces of the semiconductor layer 7 in the channel length direction.

It is preferable that some or all of an oxide film such as a silicon oxide ($SiO_x$) be used as the protective layer 9. If an oxide film is used, when oxygen loss occurs in the oxide semiconductor layer 7, it becomes possible to recover from the oxygen loss using the oxygen included in the oxide film, and thus, oxygen loss of the oxide semiconductor layer 7 can be reduced more effectively.

It is preferable that the thickness of the protective layer 9 be 100 nm to 500 nm. If the thickness is greater than or equal to 100 nm, the surface of the oxide semiconductor layer 7 can be protected more reliably during the patterning process for the source/drain electrode and the like. On the other hand, if the thickness is more than 500 nm, a greater level difference between the source electrode 11 and drain electrode 13 occurs, resulting in the risk of a disconnection or the like.

Next, with reference to figures, an example of a manufacturing method for a thin-film transistor 100 will be explained. FIGS. 2 to 5 are drawings of steps to explain the manufacturing method of a thin-film transistor 100. The figures with A are plan views, and the figures with B are cross-sectional views of A along the line A-A'. Also, the process flow is shown in FIG. 6.

Figure 2A:
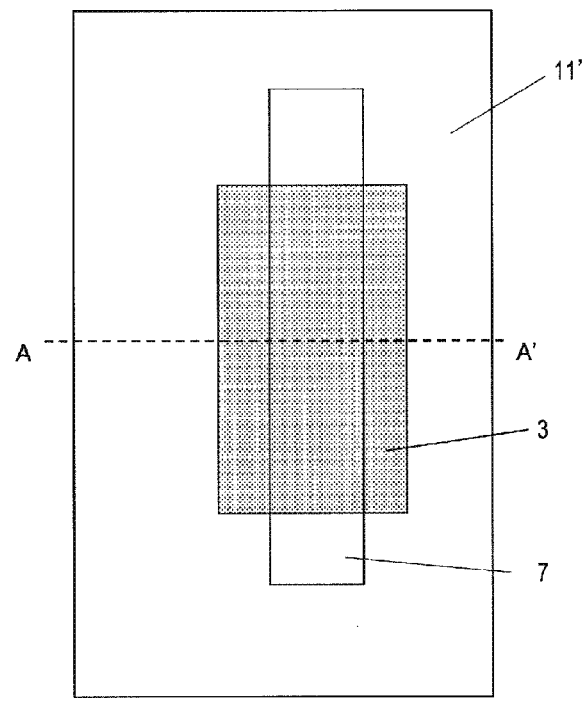
FIGS. 2A and 2B are, respectively, a plan view for explaining the method to form a thin-film transistor in Embodiment 1, and a cross-sectional view along the line A-A'.
Figure 2B:
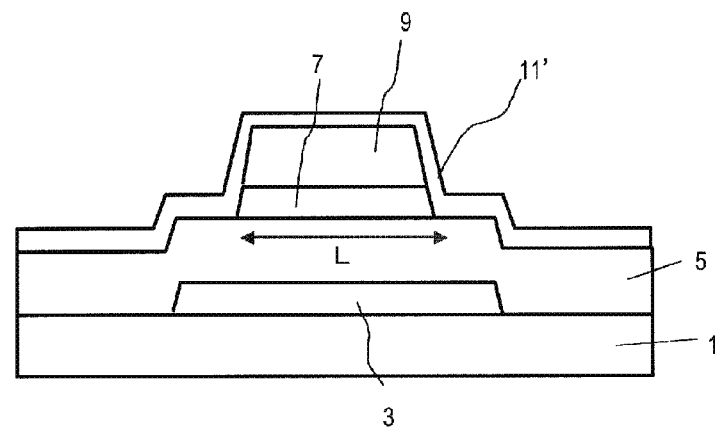

First, as shown in FIGS. 2A and 2B, on a substrate 1 such as a glass substrate, a gate 3, a gate insulating layer 5, an oxide semiconductor layer 7, a protective layer 9, and a conductive film to form a source/drain, are formed in that order. The steps of forming these layers may be the same as the steps of forming the layers of conventional ES type TFT.

First, the gate 3 is formed. In the present specification, the conductive layer including a gate bus line and the portion that functions as a TFT gate electrode will be referred to as a "gate." The gate 3 can be formed by patterning the conductive film by photolithography after forming a conductive film using argon (Ar) gas to form a gate on top of a substrate by sputtering or the like. The conductive film for forming a gate can be a single layer film made of metal, or a multilayer film for forming a gate. For example, a Ti/Al/Ti film (the Ti film being greater than or equal to 10 nm and less than or equal to 200 nm in thickness, for example; the Al film being greater than or equal to 30 nm and less than or equal to 1000 nm in thickness, for example) can be used. Next, a gate insulating layer 5 is formed so as to cover the gate 3. For example, the gate insulating layer 5 is an $SiO_x$ film that has a thickness that is greater than or equal to 200 nm and less than or equal to 600 nm. The gate insulating layer 5 is formed by CVD using silane ($SiH_4$) and dinitrogen oxide ($N_2O$) gases and the like, for example.

Next, an oxide semiconductor film (in this case, an IGZO semiconductor film) with a thickness of greater than or equal to 30 nm and less than or equal to 300 nm is formed on the gate insulating layer 5 by sputtering, for example. Then, on the IGZO semiconductor film, an insulating film (an $SiO_x$ film, for example) with a thickness of greater than or equal to 100 nm and less than or equal to 500 nm is formed using silane and dinitrogen oxide ($N_2O$) and the like by CVD, for example. Next, the IGZO semiconductor films and the insulating films are patterned. Specifically, a resist mask that covers a prescribed region of an insulating film is formed on the insulating film by photolithography. Next, the portion of the IGZO semiconductor film and insulating film that is not covered by the resist mask is removed by dry etching.

For this step of dry etching, dry etching that combines gases such as tetrafluoromethane ($CF_4$) gas, argon (Ar) gas, oxygen ($O_2$) gas and the like is used, for example. However, for an IGZO semiconductor film, etching may be performed by performing wet etching using oxalic acid (HOOC—COOH) solution or the like along with dry etching. After this, the resist mask is removed. The oxide semiconductor layer 7 and protective layer 9 are obtained in this manner. Furthermore, instead of the IGZO semiconductor film, other oxide semiconductor films can be used to form the oxide semiconductor layer 7.

Next, a conductive film 11' for forming the source electrode and the drain electrode is formed so as to cover the entire substrate 1. A Ti/Al/Ti (the Ti film being greater than or equal to 10 nm and less than or equal to 200 nm in thickness, for example; the Al film being greater than or equal to 30 nm and less than or equal to 1000 nm in thickness, for example) film is formed as a conductive film 11', for example, by sputtering with argon (Ar) gas. It is preferable that the thickness of the conductive film 11' (later, the thickness of the source/drain electrode) be greater than or equal to 30 nm from the perspective of preserving the characteristics of TFT. On the other hand, if the thickness of the conductive film 11' is less than or equal to 1000 nm, the parasitic capacitance Cgd and Cgs of the TFT can be suppressed effectively.

Figure 3A:
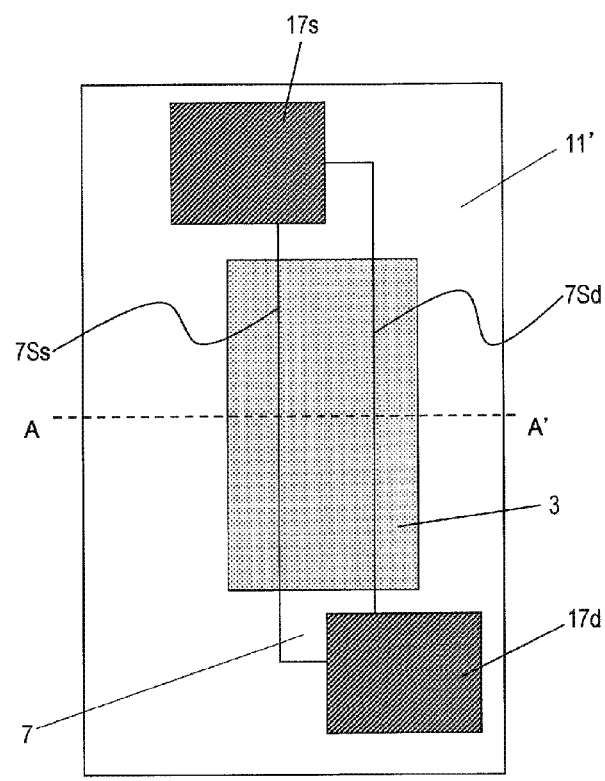
FIGS. 3A and 3B are, respectively, a plan view for explaining the method to form a thin-film transistor in Embodiment 1, and a cross-sectional view along the line A-A'.
Figure 3B:
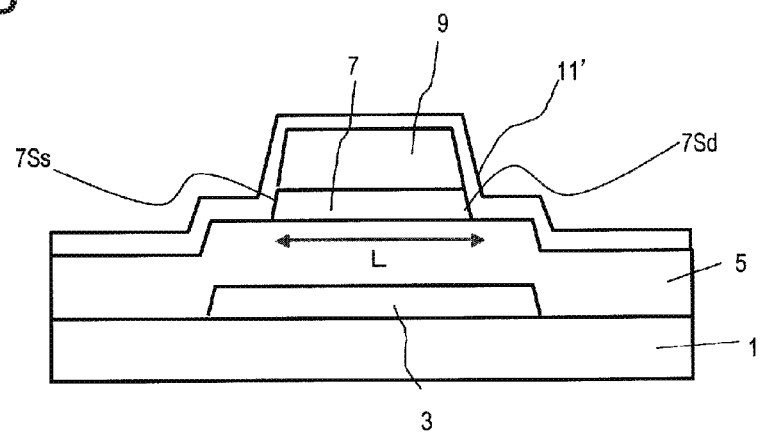

Next, resist patterns 17s and 17d for performing the patterning of the conductive layer 11' are formed on the conductive layer 11' as shown in FIGS. 3A and 3B. Resist patterns 17s and 17d are separated from each other. The resist pattern 17s is disposed so as to cover the side face 7Ss on the source side of the oxide semiconductor layer 7 and not the side face 7Sd on the drain side. The resist pattern 17d is disposed so as to cover the side face 7Sd on the drain side of the oxide semiconductor layer 7 and not the side face 7Ss on the source side.

Figure 4A:
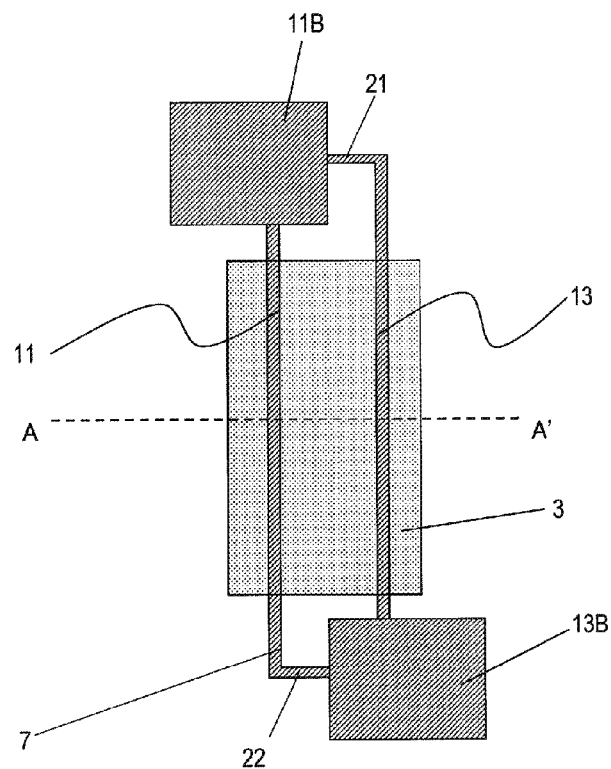
FIGS. 4A and 4B are, respectively, a plan view for explaining the method to form a thin-film transistor in Embodiment 1, and a cross-sectional view along the line A-A'.
Figure 4B:
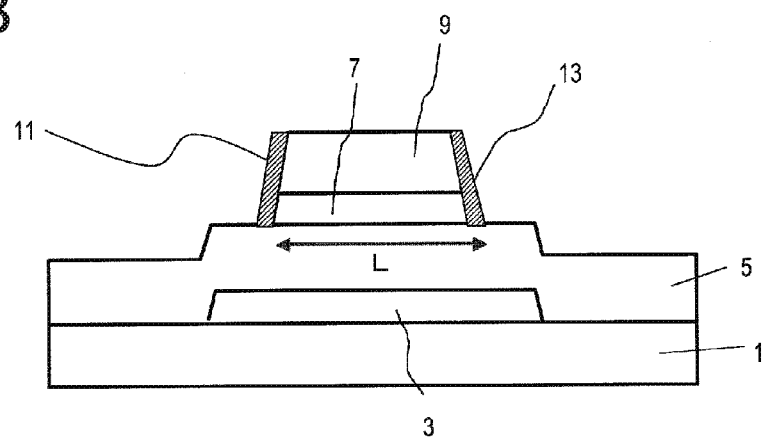

Next, anisotropic etching is performed on the conductive layer 11' using the resist patterns 17s and 17d as masks. The RIE (reactive ion etching) method of dry etching can be used as anisotropic etching. Alternatively, the ICP (inductively coupled plasma) method of dry etching may be performed. In this manner, as shown in FIGS. 4A and 4B, the portions of the conductive film 11' that are covered by the resist patterns 17s and 17d, and the portions arranged on the side faces of the oxide semiconductor layer 7 remain, and other portions are removed. After this, the resist patterns 17s and 17d are removed. During the anisotropic etching at the time, a dry etching method that combines gases such as chlorine ($Cl_2$) gas, boron trichloride ($BCL_3$) gas, argon gas, and oxygen gas as appropriate is used, for example.

Due to the anisotropic etching of the conductive film 11', a source electrode 11 on the side face 7Ss on the source side of the oxide semiconductor layer 7, and a drain electrode 13 on the side face 7Sd on the drain side of the oxide semiconductor layer 7 are formed respectively. Furthermore, the portion of the conductive film 11' that was covered by the resist pattern 17s becomes a source connecting member 11B, and the portion of the conductive film 11' that was covered by the resist pattern 17d becomes the drain connecting member 13B. Also, the source connecting member 11B is connected to a source bus line. Alternatively, the source connecting member 11B may also be a part of the source bus line. Furthermore, in the present specification, the layer including the source electrode 11 and the portion (source connecting member 11B, source bus line and the like) that is formed integrally with the source electrode 11 is referred to as the "source electrode layer", and the layer including the drain electrode 13 and the portion (drain connecting member 13B) that is formed integrally with the drain electrode 13 is referred to as the "drain electrode layer." Also, at this stage, the source connecting member 11B is not only connected to the source electrode 11, but is also connected to the drain electrode 13 via the portion (first conductive portion) 21 of the conductive film 11' remaining on the side face at the channel width direction of the oxide semiconductor layer 7. Also, at this stage, the drain connecting member 13B is not only connected to the drain electrode 13, but is also connected to the source electrode 11 via the portion (second conductive portion) 22 of the conductive film 11' that remains on the side face at the channel width direction of the oxide semiconductor layer 7. Thus, the source electrode layer and the drain electrode layer are not electrically separated.

Also, the thickness of the source electrode 11 and the drain electrode 13 generally becomes smaller than the thickness of the aforementioned conductive film 11' because these electrodes were formed on the side faces 7Ss, 9Ss, 7Sd and 9Sd by sputtering.

Furthermore, a portion of the surface of these electrodes may be etched as the surface of the conductive film 11' that will become the source electrode 11 and the drain electrode 13 is exposed to the atmosphere during the process in which the source electrode 11 and the drain electrode 13 is formed from the conductive film 11'. As a result, the thickness of the source electrode 11 and the drain electrode 13 may become smaller that the thickness of the aforementioned conductive film 11'. Even in such cases, it is acceptable as long as the thickness of the source electrode 11 and the drain electrode 13 are within the prescribed region.

Figure 5A:
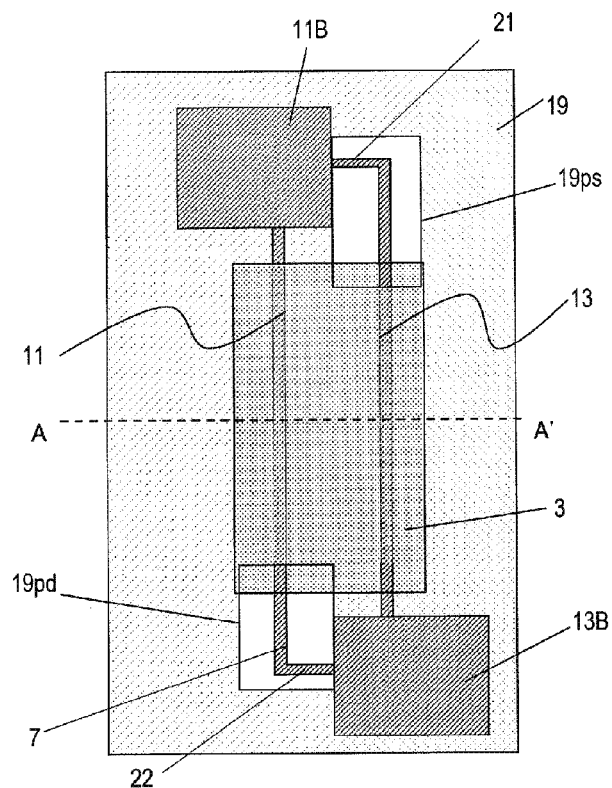
FIGS. 5A and 5B are, respectively, a plan view for explaining the method to form a thin-film transistor in Embodiment 1, and a cross-sectional view along the line A-A'.
Figure 5B:
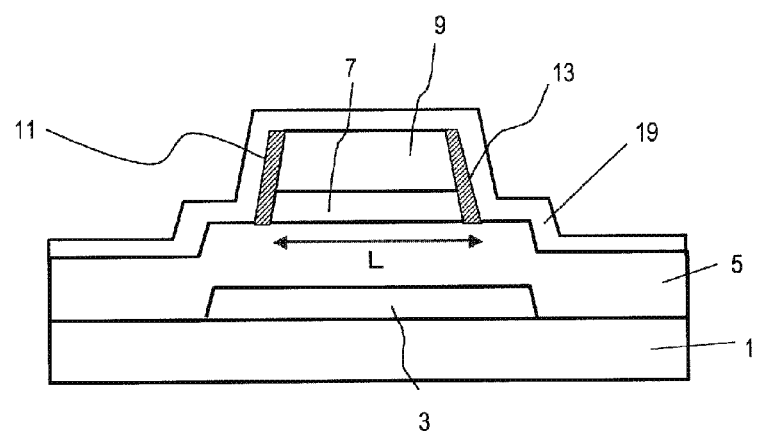
Figure 6:
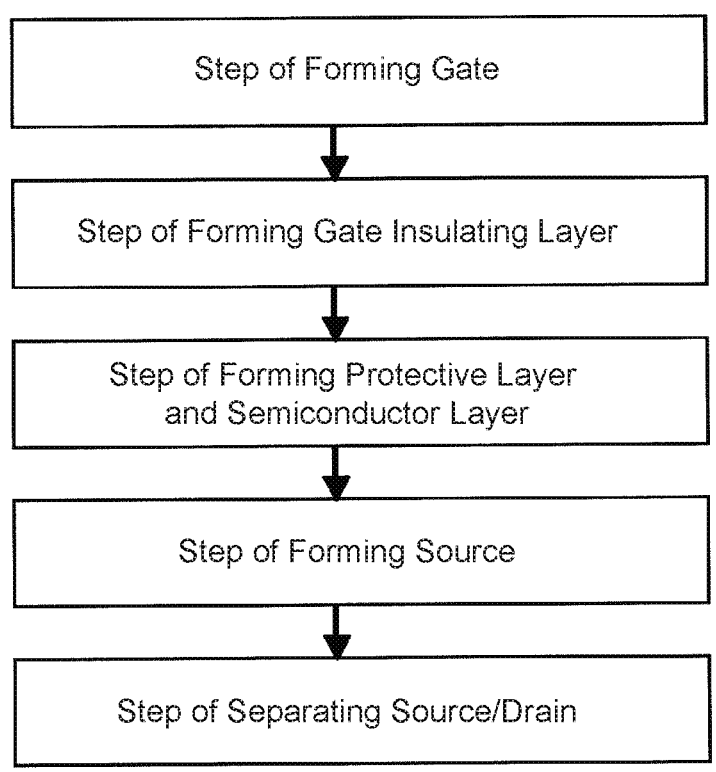
FIG. 6 is a process flow to form a thin-film transistor in Embodiment 1.

Next, a resist pattern 19 that contains openings 19ps and 19pd is formed as shown in FIGS. 5A and 5B. The opening 19ps is arranged so that at least a portion of the first conductive portion 21 that is arranged on the side face at the channel width direction of the oxide semiconductor layer 7 and preferably the entirety of the first conductive portion 21 is exposed. The opening 19pd is arranged so that at least a portion of the second conductive portion 22 that is arranged on the side face at the channel width direction of the oxide semiconductor layer 7 and preferably the entirety of the second conductive portion 22 is exposed. In this example, the opening 19ps exposes the drain electrode 13 that is arranged on the portion of the side face of the oxide semiconductor layer 7 that is not overlapping with the gate 3. Furthermore, the opening 19pd is arranged in a manner that the source electrode 11 that is arranged on the portion of the side face of the oxide semiconductor layer 7 that is not overlapping with the gate 3.

After this, although not shown, the portion of the source and drain that was exposed by the openings 19pd and 19ps are removed using the resist pattern 19 as a mask. As the conductive film arranged on the side face of the oxide semiconductor layer 7 is removed in this manner, it is preferable to use isotropic etching and not anisotropic etching. A wet etching method using an etchant or the like that includes hydrogen fluoride and/or nitric acid may also be used. Then, the resist pattern 19 is peeled off. Due to this, the source electrode layer and the drain electrode layer can be separated (source/drain separation process).

The arrangement and form of the openings 19pd and 19ps are not limited to the examples shown in the figures. The opening 19pd should be arranged so that the drain connecting member 13B and the source electrode 11 are separated by the present etching process. Similarly, the opening 19ps should be arranged so that the source connecting member 11B and the drain electrode 13 are separated. In this manner, the thin-film transistor 100 as shown in FIG. 1 is obtained.

The manufacturing method of the thin-film transistor 100 is not limited to the method mentioned above. Below, other methods of manufacturing the thin-film transistor 100 in the present embodiment will be explained.

Figure 7A:
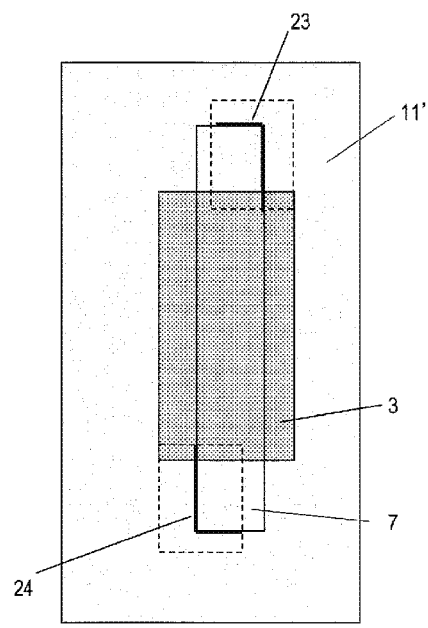
FIGS. 7A and 7B are, respectively, a plan view of a step for explaining another method to form a thin-film transistor in Embodiment 1.

First, as shown in FIG. 7A, with a method similar to the method explained with reference to FIG. 2, a gate 3, a gate insulating layer 5, a semiconductor layer 7, a protective layer 9 and a conductive film 11' is formed in this order on a substrate 1. However, when the oxide semiconductor layer 7 and the protective layer 9 are formed, the taper of the oxide semiconductor layer 7 and a portion (the portion that separates the source electrode layer and the drain electrode layer) 23 and 24 of the side face of the protective layer 9 are made to be more gradual than other portions (the portion where the source and drain electrodes are formed) in a later step. For example, when patterning is performed on the oxide semiconductor film and protective film (insulating film) by half exposure and resist withdrawal, the tapering of the oxide semiconductor layer 7 and the prescribed areas 23 and 24 or the side face of the protective layer 9 is made to be more gradual. If the taper angle of the portions where the source and drain electrodes are on the side faces of the oxide semiconductor layer 7 is a first taper angle α, and the taper angle of the portions 23 and 24 that separate the source and the drain is a second taper angle β, then α>β. The first taper angle α is greater than or equal to 70° and less than 90°, for example, and the second taper angle β is greater than or equal to 45° and less than 70°, for example.

Figure 7B:
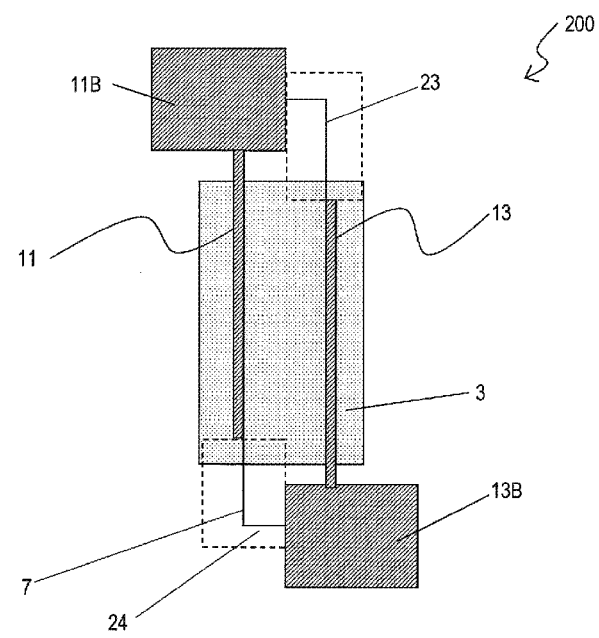

Then, using a method similar to the method that was explained using FIG. 3 as a reference, anisotropic etching of the conductive film 11' is performed using resist patterns 17s and 17d. Due to this, as shown in FIG. 7B, the portions of the conductive film 11' that were covered by the resist patterns 17s and 17d remain without being etched, and become a source connecting member 11B and a drain connecting member 13B. Furthermore, on the portions 23 and 24 of the side faces of the oxide semiconductor layer 7 and the protective layer 9 that have gradual tapers, the conductive film 11' is removed by anisotropic etching, and on the other portions, the conductive film 11' remains without being etched, and becomes a source electrode 11 and a drain electrode 13. In this manner, a thin-film transistor 200 is obtained.

The thin-film transistor 200 is different from the thin-film transistor 100 in that the taper is more gradual for the portions 23 and 24 of the side faces of the oxide semiconductor layer 7 on which the source and drain electrodes 11 and 13 have not yet been formed than in portions where the source and drain electrodes 11 and 13 are formed. Other configurations are similar to the configurations of the thin-film transistor 100 shown in FIG. 1.

In the method shown in FIGS. 2 to 5, in addition to the resist mask (resist patterns 17s and 17d) used in the patterning process of the conductive film 11', a resist mask (resist pattern 19) used in the source/drain separation process is formed. In other words, to form the source electrode layer and the drain electrode layer, photolithography must be performed twice. By contrast, according to the method shown in FIG. 7, the photolithography performed in the source/drain separation process can be omitted, and thus, there is an advantage from a manufacturing process perspective.

Next, the effects of the present embodiment will be explained using the figures as a reference.

Figure 8A:
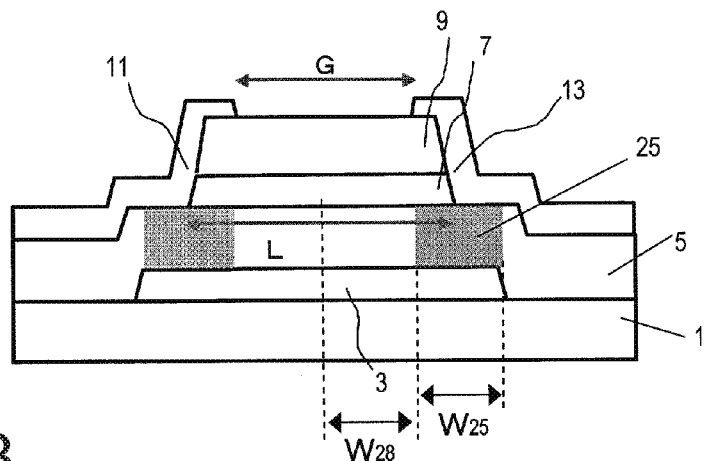
FIGS. 8A to 8C are drawings for explaining the effects of Embodiment 1 in the present invention, and are, respectively, a cross-sectional view of a conventional ES type TFT, a cross-sectional view of a conventional CE type TFT, and a drawing shown as an example of an ES type TFT (thin-film transistor 100) in the present embodiment.
Figure 8B:
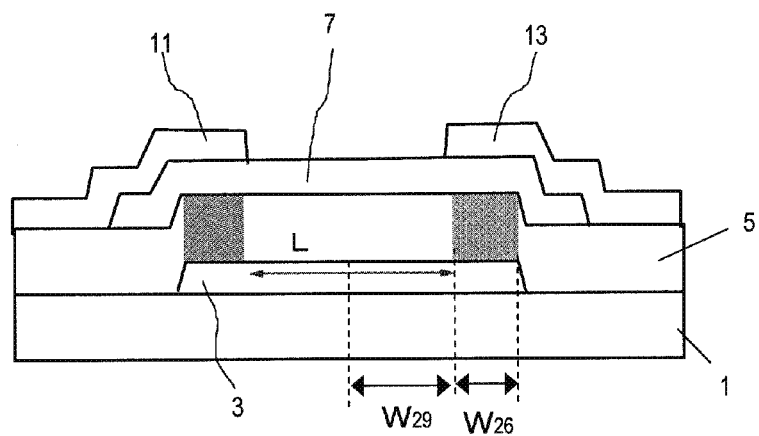
Figure 8C:
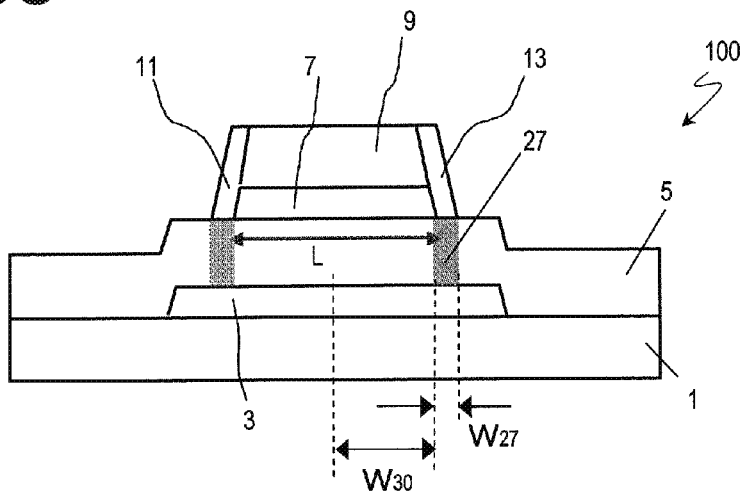

FIGS. 8A to 8C are figures for explaining the effects of the present embodiment, and are respectively figures that show examples of a cross-sectional view of a conventional ES type TFT, a cross-sectional view of a conventional CE type TFT, and an ES type TFT of the present embodiment. In FIG. 8, the same reference characters are used for the same constituting elements as FIG. 1, and descriptions thereof are omitted.

Out of the parasitic capacitance of TFT, Cgd will be discussed first. In a situation in which the semiconductor layer 7 has become conductive due to an applied voltage, it can generally be thought that a capacitance Cgd is formed at portions $W_{25}$ and $W_{28}$ shown in FIG. 8A in a conventional ES type TFT, portions $W_{26}$ and $W_{29}$ shown in FIG. 8C in a conventional CE type TFT, and portions $W_{27}$ and $W_{30}$ shown in FIG. 8C in the present embodiment. Here, $W_{25}$, $W_{26}$, and $W_{27}$ are portions where the gate 3 overlaps the source or drain electrode 11 and 13 through the gate insulating layer 5. $W_{28}$, $W_{29}$, and $W_{30}$ are regions between the source electrode 11 and the drain electrode 13, where the gate 3 and the semiconductor layer 7 overlap through the gate insulating layer 5, and are portions that are close to the drain electrode 13 side. In other words, the size of $W_{28}$, $W_{29}$, and $W_{30}$ is equal to half the distance between the source electrode 11 and the drain electrode 13.

As shown in FIG. 8B, in the conventional CE type TFT, the distance between the source electrode and the drain electrode after the source/drain separation determines the channel length L. Due to this, the channel length L can be reduced to substantially the same length (for example, 3 μm) as the minimum etching width of the process. Furthermore, in this TFT, the size of the portion $W_{26}$ where the gate 3 and the source or drain electrode 11 and 13 overlaps through the gate insulating layer 5 also depends on the accuracy of the alignment, but is greater than or equal to 1 μm.

Meanwhile, as shown in FIG. 8A, in the conventional ES type TFT, the channel length L is greater than the distance G between the source electrode 11 and the drain electrode 13. The channel length L for when the distance G shortened to substantially the same length (for example, 3 μm) as the minimum etching width in the process depends on the alignment accuracy (hereinafter, simply referred to as "alignment accuracy.") between the layers in photolithography, but is 5 μm, for example. Reducing the channel length L to the minimum etching width is difficult. Furthermore, in this TFT, the size of the portion $W_{25}$ where the gate 3 and source or drain electrodes 11 and 13 overlap via the gate insulating layer 5 also depends on the accuracy of the alignment, but is greater than or equal to 2 μm.

By contrast, in the present embodiment, a self-alignment process is used to form the source and drain electrodes 11 and 13, and thus, as shown in FIG. 8C, the channel length L can be reduced to substantially the same length (for example, 3 μm) as the minimum etching width in the process. Furthermore, along with the reduction in the channel length L, the portion $W_{27}$ where the gate 3 overlaps the source and drain electrodes 11 and 13 through the gate insulating film 5 is determined by the width (thickness of the conductive film 11') of the source and drain electrodes 11 and 13, regardless of the alignment accuracy. The size of $W_{27}$, for example, is greater than or equal to 30 nm and less than or equal to 1000 nm. The size of $W_{28}$, $W_{29}$, and $W_{30}$ are almost equal, and therefore there is no need to take this into account when comparing their capacitances Cgd. The size of $W_{27}$ is smaller than $W_{25}$, so it could be understood that according to the present embodiment, the Cgd capacitance can be reduced more than by conventional methods.

The same applies for the capacitance Cgs. According to the present embodiment, the capacitance Cgs can also be reduced.

In this manner, according to the present embodiment, it is possible to reduce the channel length L and reduce the circuit area more than in the conventional ES type TFT (FIG. 8A). Furthermore, the circuit area can be further reduced since the capacitances Cgd and Cgs can be reduced and the circuit area can be further reduced, and the display quality as an LCD pixel TFT can be improved.

Furthermore, according the present embodiment, a channel protective layer 9 is provided, and compared to the CE type TFT (FIG. 8B), the degradation of the oxide semiconductor layer 7 can be suppressed and the process stability can be improved. Furthermore, compared to the CE type TFT, the circuit area can be further reduced since the capacitances Cgd and Cgs can be reduced, and the display quality as an LCD pixel TFT can be improved.

Embodiment 2

Below, Embodiment 2 of a semiconductor device of the present invention will be explained with reference to figures. The semiconductor device of the present embodiment is different from the thin-film transistor 100 shown in FIG. 1 in that a drain electrode is formed so as to be self-aligned on side faces of a protective layer and an oxide semiconductor layer, and a source electrode is formed so as to cover a portion of an upper face of the protective layer, the protective layer, and a side face of the oxide semiconductor layer.

Figure 9A:
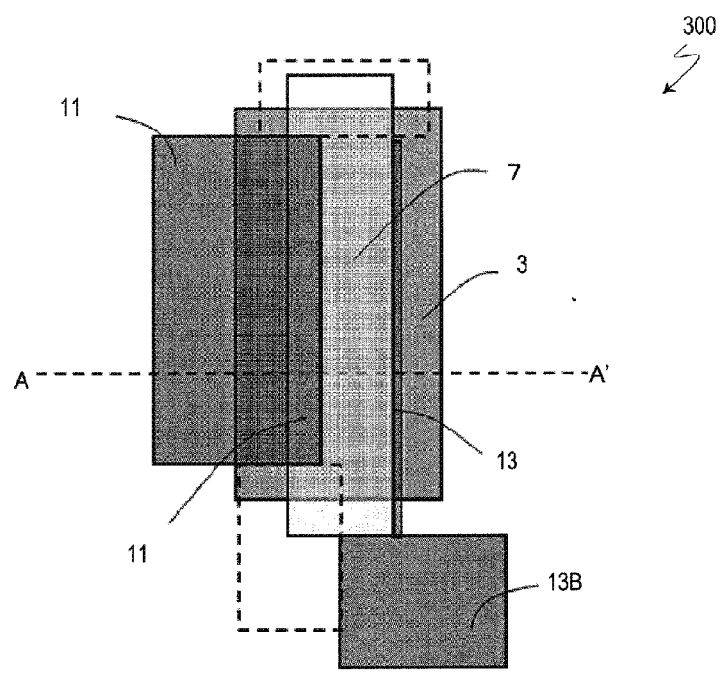
FIGS. 9A and 9B are drawings that schematically show thin-film transistors of the semiconductor device in Embodiment 2 of the present invention.
Figure 9B:
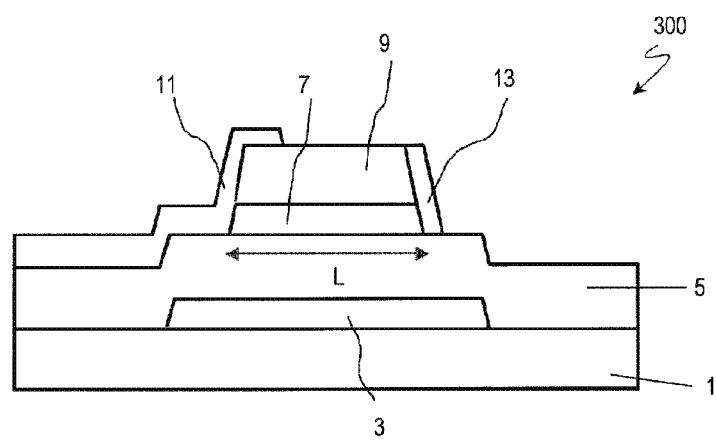

FIGS. 9A and 9B are respectively, a plan view and a cross-sectional view of the thin-film transistor of the present embodiment.

The source electrode 11 of a thin-film transistor 300 has a similar structure to the conventional ES type TFT (FIG. 15). In other words, the thin-film transistor 300 has a pattern in which the source electrode 11 covers a portion of the upper face of the protective layer 9, the side face of the protective layer 9, the side face of the oxide semiconductor layer 7, and the upper face of the gate insulating layer 5. Other configurations are similar to those of the thin-film transistor 100 shown in FIG. 1.

According to the present embodiment, the channel length L is larger than the channel length L of the thin-film transistor 100 shown in FIG. 1, but it is possible to reduce the channel length L compared to the conventional ES type TFT. Therefore, the increase in channel length L from adopting the ES type can be suppressed.

The present embodiment can be suitably used when there is a desire to provide additional capacitance on at least one side with a source electrode or a drain electrode, for example. For example, if a thin-film transistor 300 is used for a monolithic gate driver or an active type organic EL circuit, then the circuit area can be reduced because there is no need to form an additional capacitance. As a result, the present embodiment is advantageous in being able to achieve a narrower frame, a greater aperture ratio, and a greater display brightness.

The thin-film transistor 300 can be manufactured in a process similar to the aforementioned process shown in FIGS. 2 to 5 or the aforementioned process shown in FIG. 7. However, during the patterning process for the conductive film 11', a source electrode 11 that covers the entirety of the side faces of the oxide semiconductor layer 7 and a portion of the upper face of the protective layer 9 is formed. The steps thereafter are similar to the process mentioned above.

Embodiment 3

Below, Embodiment 3 of a semiconductor device of the present invention will be explained with reference to figures. In the present embodiment of the semiconductor device, an oxide semiconductor layer is formed at a recess in a gate insulating layer, and source/drain electrodes are only formed on side walls of the oxide semiconductor layer.

Figure 10:
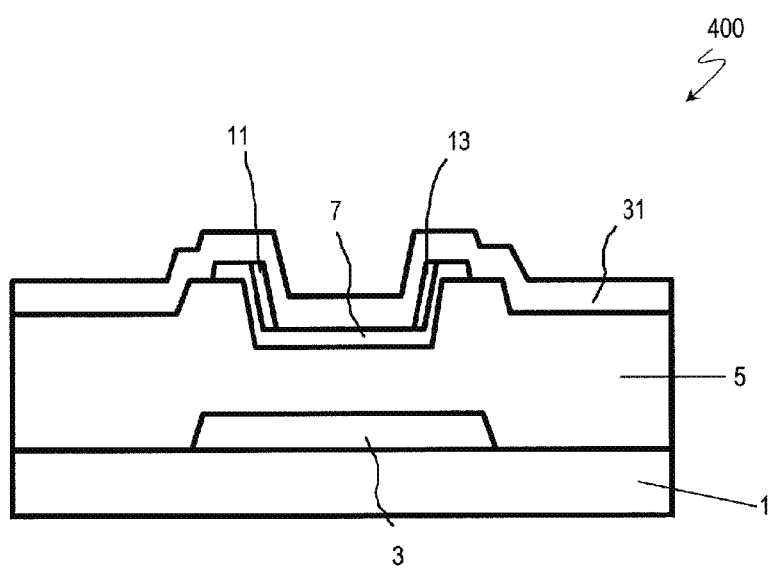
FIG. 10 is a drawing that schematically shows thin-film transistors of the semiconductor device in Embodiment 3 of the present invention.

FIG. 10 is a cross-sectional view of the thin-film transistor of the present embodiment.

In the thin-film transistor 400, the gate insulating layer 5 has a recess. In this example, when the thin-film transistor is seen from a direction normal to the substrate 1, the recess portion is in a trench shape that extends in the channel width direction. Within the recess portion of the gate insulating layer 5 and the upper face of the gate insulating layer 5, an oxide semiconductor layer 7 is formed so as to cover the bottom and the side walls of the recess. A drain electrode 13 is provided on a portion of the oxide semiconductor layer 7 on a side wall in the channel length direction. A source electrode 11 is provided on a portion of the oxide semiconductor layer 7 on the other side wall in the channel length direction. The source electrode 11 and the drain electrode 13 are not formed on the portion of the oxide semiconductor layer 7 on the upper face of the gate insulating layer 5. The source electrode 11 and the drain electrode 13 are separated from each other. The oxide semiconductor layer 7, the source electrode 11 and the drain electrode 13 are covered by a protective layer 31.

A source electrode 11 and a drain electrode 13 as mentioned above is formed by self-alignment in the following manner, for example. First, on the gate insulating layer 5 with a recess, an oxide semiconductor layer 7 and a conductive film for forming an electrode will be formed in this order. Next, using the prescribed mask, anisotropic etching similar to that of Embodiment 1 of the present invention will be performed on the conductive film. As a result, portions of the conductive film located on the side walls of the recess remain without being etched even if these portions are not covered by a mask, and these remaining portions become the source electrode 11 and the drain electrode 13, respectively. According to this method, the upper edge face (upper face) of the source electrode 11 and the drain electrode 13 and the upper face of the oxide semiconductor layer 7 become one continuous surface.

Also, at least one of the source and drain electrodes 11 and 13 can be formed in a self-aligned manner on only the side walls of the recess, and the other one can have a pattern that is set by a resist pattern similar to a conventional configuration.

The present embodiment also presents an advantage similar to those mentioned above for Embodiments 1 and 2 in that the capacitance Cgd can be reduced.

Furthermore, for the above-mentioned Embodiments 1 to 3, the gate 3, the source electrode 11, or the drain electrode 13 are formed from the Ti/Al/Ti film, but the electrodes may also be formed from a single layer metal film using one of the following or a multilayer metal film using several of the following: aluminum, titanium, molybdenum (Mo), tungsten (W), copper (Cu), silver (Ag) or the like. Furthermore, these metals may also include oxygen, nitrogen, or other metal elements and the like.

The gate 3, the source electrode 11, or the drain electrode 13 may be an Al/Ti multilayer film that includes aluminum and titanium, a Ti/Al multilayer film, a Mo/Al/Mo multilayer film that includes aluminum and molybdenum, an Al/Mo/Al multilayer film, a Ti/Cu/Ti multilayer film that includes copper and titanium, a Cu/Ti, Ti/Cu multilayer film, a Mo/Cu/Mo multilayer film that includes copper and molybdenum, or a Cu/Mo, Mo/Cu multilayer film, for example. Furthermore, the metal film for forming the gate 3, the source electrode 11 and the drain electrode 13 can be selected independently from each other. At this step, the film forming condition, the etching method, and the etching condition may be changed in accordance with the multilayer film within conventional technology.

Figure 16:
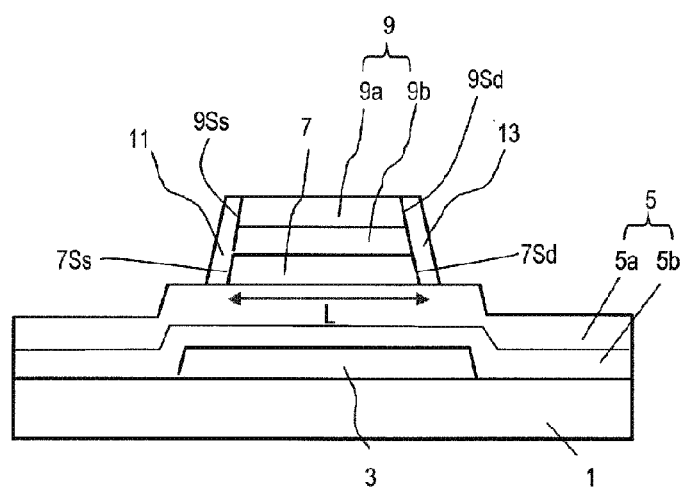
FIG. 16 is a cross-sectional view of another example of a thin-film transistor of a semiconductor device in Embodiment 1.

Furthermore, for the above-mentioned Embodiments 1 to 3, the gate insulating layer 5 and protective layer 9 may respectively have a multilayer structure. In the case of Embodiments 1 and 2, as shown in FIG. 16, the gate insulating layer 5 may have a silicon oxide ($SiO_x$) 5a and a silicon nitride ($SiN_x$) 5b layered one on top of the other.

To form a silicon nitride film, the CVD method using silane ($SiH_4$), ammonia ($NH_3$), hydrogen ($H_2$), and nitrogen ($N_2$) gas and the like may be used. For example, the thickness of the silicon oxide ($SiO_x$) 5a may be 50 nm and the thickness of the silicon nitride ($SiN_x$) 5b may be 325 nm. In the same manner, the protective layer 9 may have a multilayer structure with silicon nitride (SiNx) 9a and silicon oxide (SiOx) 9b. For example, the thickness of the silicon nitride (SiNx) 9a may be 100 nm and the thickness of silicon oxide (SiOx) 9b may be 150 nm.

Examples of Semiconductor Devices in Embodiments 1 to 3

Next, examples of a circuit for a semiconductor device of the above-mentioned embodiments will be explained.

The semiconductor devices in Embodiments 1 to 3 may be an active matrix substrate or a driver circuit and the like used for display devices such as liquid crystal display devices and organic EL display devices. This type of semiconductor device is provided with a plurality of TFTs with different functions. In this case, at least one of the plurality of TFTs needs to be one of the above-mentioned thin-film transistors 100 to 400. It is preferable that one of the thin-film transistors 100 to 400 be used as a TFT through which a relatively larger amount of current flows. As a result, the area of the entire circuit can be reduced, because the channel length of other TFTs can be reduced and the auxiliary capacitance for appropriate operation of the entire circuit can be reduced, as the parasitic capacitance of the TFT through which a relatively larger amount of current flows can be reduced compared to the parasitic capacitances of other TFTs.

The semiconductor device in Embodiments 1 to 3 can be a liquid crystal display device, for example.

Figure 11A:
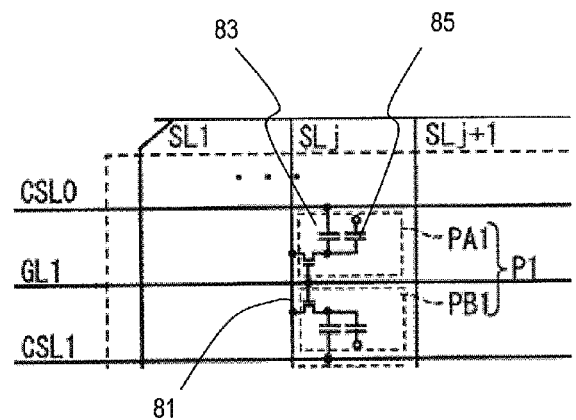
FIGS. 11A to 11C are respectively drawings shown as examples of the circuit configurations of Embodiments 1 to 3 in the present invention.

FIG. 11A shows an example of a portion of the circuit configuration of the active matrix substrate in a liquid crystal display device. The active matrix substrate has a plurality of source wiring lines SL formed on the insulating substrate, a plurality of gate wiring lines GL, and a plurality of pixel TFTs 81 formed at the intersections of the source and gate wiring lines. The pixel TFTs 81 may be thin-film transistors 100 or 200 in Embodiment 1. In addition, the pixel TFTs may also be the thin-film transistor 300 in Embodiment 2 or the thin-film transistor 400 in Embodiment 3.

The source electrodes of each pixel TFTs 81 are connected to the source wiring line SL, the gate electrodes are connected to the gate wiring line GL, and the drain electrodes are connected to the pixel electrode (not shown). In the example shown, an auxiliary capacitance wiring line (Cs wiring line, common wiring line) CSL is formed parallel to the gate wiring line GL, and auxiliary capacitances (Cs) 83 are provided between the common wiring lines and the pixel TFTs 81, respectively. An auxiliary capacitance 83 is connected in parallel with a liquid crystal capacitance (Clc) 85.

Furthermore, the thin-film transistors 100 to 400 are not only provided as a pixel TFT (switching element), but may also be used as a TFT for peripheral circuits such as drivers. A portion or the entirety of the peripheral circuit may be formed on the active matrix substrate (monolithically formed). Peripheral circuits are formed in the region (referred to as the "frame region") that excludes the region (referred to as the "display area") that includes a plurality of pixels of the active matrix substrate. In such cases, the oxide semiconductor TFT in Embodiments 1 to 3 uses an oxide semiconductor layer that has a high mobility (for example, more than or equal to 10 cm$^2$/Vs) as an active layer, thus, not only can the TFT be suitably used for pixels, it can also be suitably used for circuits.

Figure 11B:
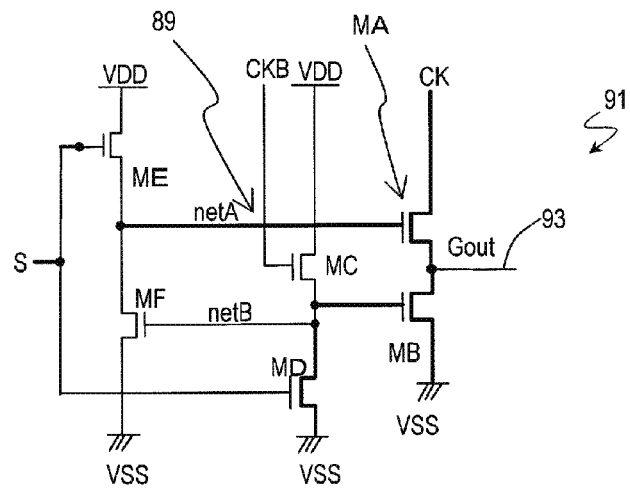

FIG. 11B is a circuit diagram of a shift register in a gate driver (monolithic gate driver) that is formed on an active matrix substrate of a crystal display device.

The monolithic gate driver includes a plurality of shift registers that sequentially output a gate signal $G_{out}$. Each shift register 91 has a gate signal output line 93 that outputs a gate signal $G_{out}$ to a corresponding gate bus line (not shown). Also, although not shown, the gate signal output line 93 of the nth shift register is connected to the connecting line for inputting the set signal S to the n+1th shift register.

Each shift register 91 possesses a plurality of transistors MA to MF. Among these transistors, the transistor MA is a transistor that outputs the gate signal Gout. The wiring line that is connected to the gate electrode of the transistor MA is referred to as netA. The shift register shown uses a bootstrapping mechanism to increase the output. In other words, as the signal outputted from the previous transistor enters S, the potential of the wiring line netA (which is the wiring line on the gate electrode side of the thin-film transistor MA) rises, and by further increasing the potential of the clock CK after the potential is raised, the potential of the wiring netA is raised by capacitance (the capacitance between the source electrode of the thin-film transistor MA and the gate electrode) coupling, and the output of MA, which is an output transistor that is directly connected to Gout, is increased. For this type of shift register, for example, thin-film transistors 100, 200, 300, and 400 can be used as a transistor MA.

The semiconductor device in Embodiments 1 to 3 can be an organic EL display device, or an active matrix substrate used for an organic EL display device. In an active matrix substrate of an organic EL display device, light-emitting elements are generally formed in each pixel. Each light-emitting element is provided with an organic EL layer, a TFT for switching, and a TFT for driving.

Figure 11C:
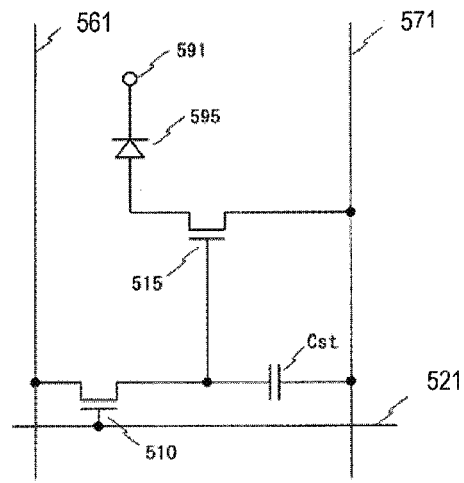

FIG. 11C is a diagram that shows a circuit (pixel circuit) that is provided in each pixel of the active matrix substrate of the organic EL display device. The active matrix substrate of the organic EL display device has a plurality of source wiring lines 561 formed on the insulating substrate, a plurality of gate wiring lines 521, and a power source line 571 that extends in parallel with the source wiring 561. A switching TFT 510 that is arranged on the intersection of source wiring 561 and gate wiring 521, an organic EL layer 595, and a driver TFT 515 that is arranged between the power source line 571 and the organic EL layer 595 is formed in the respective regions (pixel) that are surrounded by these wiring lines 561, 521, and 571. The gate for the switching TFT 510 is connected to the gate wiring line 521, and the source is connected to the source wiring line 561. The drain of the switching TFT 510 is connected to a gate of the driving TFT 515. A capacitor (storage capacitance) Cst is connected between the source and gate of the driving TFT 515. Furthermore, the source of the driving TFT 515 is connected to the power source line 571 and the drain is connected to the organic EL layer 595.

For this type of pixel circuit, for the driving TFT 515, for example, the thin-film transistor 100 and 200 in Embodiment 1, the thin-film transistor 300 used in Embodiment 2 or the thin-film transistor 400 in Embodiment 3 can be used.

Embodiment 4

Below, a semiconductor device of the Embodiment 4 of the present invention will be explained. The semiconductor device of the present embodiment has a portion (hereinafter, referred to as "wiring cross portion") where two different wiring layers overlap (intersect) through an insulating layer. If the semiconductor device for the present embodiment is an active matrix substrate, or display device, or the like, for example, the above-mentioned "wiring cross portion" may be a portion where, from the direction normal to the surface of the substrate, the source wiring layer (including the source electrode layer and the drain electrode layer) that is formed from the same conductive film as the source, and the gate wiring layer that is formed from the same conductive film as the gate intersect.

Figure 12A:
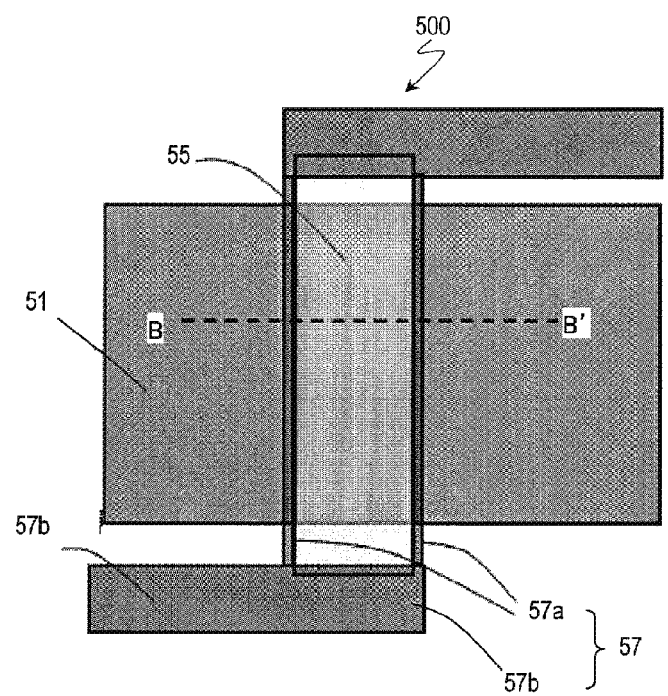
FIGS. 12A and 12B are drawings that schematically show a wiring cross portion of the semiconductor device in Embodiment 4 of the present invention.
Figure 12B:
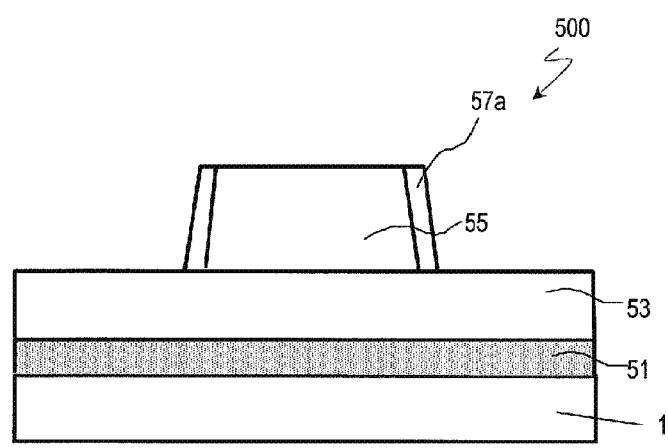

FIG. 12 is a figure that schematically shows the wiring cross portion 500 of the semiconductor device for the present embodiment. FIG. 12A is a plan view of the wiring cross portion 500, and FIG. 12B is a cross-sectional view along the line B-B'.

The semiconductor device of the present embodiment is provided with a substrate 1, a lower wiring layer (for example, the gate layer) 51 that is formed on the substrate 1, the lower insulating layer (for example, the gate insulating layer) 53 that covers the gate layer 51, and an upper wiring layer (for example, source wiring layer) 57. The lower wiring layer 51, for example, may be formed by a method similar to the method of forming the gate for Embodiment 1. In the region where the wiring cross portion 500 is formed and the lower wiring layer 51 and the upper wiring layer 57 overlap, an island-shaped upper insulating layer 55 is arranged on the lower insulating layer 53. When seen from a direction normal to the surface of the substrate 1, at least a portion of the portion where the upper wiring layer 57 overlaps the lower wiring layer 51 is formed on the side walls of the upper insulating layer. It is preferable that all of the portion of the upper wiring layer 57 that overlaps the lower wiring layer 51 *be* formed on the sidewalls of the upper insulating layer 55.

In the present embodiment, the upper wiring layer 57 is arranged on the first wiring line 57*b* and on the wiring cross portion 500, and includes a second wiring line (also referred to as "side wall portion") 57*a* arranged on the side walls of the upper insulating layer 55. For the wiring cross portion 500, the upper wiring layer 57 is not formed on the upper face of the upper insulating layer 55.

The second wiring line 57*a*, for example, is formed so as to be self-aligned by a method similar to the method of forming the source/drain electrode in Embodiment 1. The first wiring line 57*b* has patterns set by the resist pattern in a manner similar to the source connecting member of Embodiment 1, for example.

Below, an example of a method of forming a wiring cross portion 500 for the present embodiment will be explained.

First, the substrate 1, a lower wiring layer 51, a lower insulating layer 53, and an upper insulating layer 55 are formed in this order. Next, the upper insulating layer 55 is patterned into an island-shape. In this patterning step, a dry etching method that combines gases such as tetrafluoromethane ($CF_4$) gas, argon (Ar) gas, and oxygen ($O_2$) gas as appropriate may be used, for example.

The side faces of the upper insulating layer 55 may be vertical with respect to the substrate 1, or may have a tapered shape. A taper angle that is greater than or equal to 70° and less than 90° is preferable, for example. If the taper angle is less than 70°, keeping the upper wiring layer 57 on the side faces of the upper insulating layer 55 will be difficult during anisotropic etching, which will be mentioned later.

Next, a conductive film (for example, a conductive film to form source and drain electrodes) is formed on the lower and upper insulating layers 53 and 55. After this, a resist pattern is formed on the conductive film. The resist pattern will be arranged such that the source bus line and the like and the region that where the wiring portion and connecting member are formed are covered and the region where the wiring cross portion is formed is not covered.

After this, anisotropic etching will be performed on the conductive film, and the resist pattern will be removed. Then, the first wiring line 57b of the upper wiring layer can be obtained from the portion of the conductive film that is covered by the resist pattern. Furthermore, the portion of the upper insulating layer 55 on the side walls of the conductive film remains without being etched, and becomes the second wiring line (side wall portion) 57a. The condition of the anisotropic etching for this step may be the same as the step for the Embodiment 1 of the present invention.

Here, the effects of the present embodiment will be explained with reference to figures.

Figure 13A:
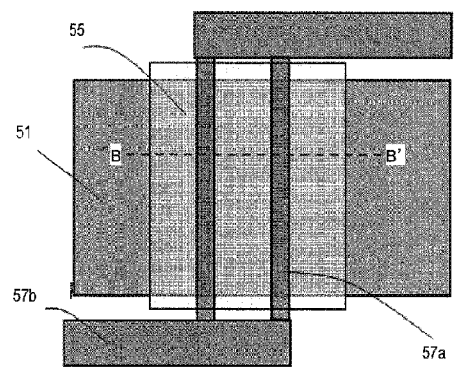
FIGS. 13A and 13B are, respectively, a plan view and a cross-sectional view of the wiring cross portion in a conventional semiconductor device.
Figure 13B:
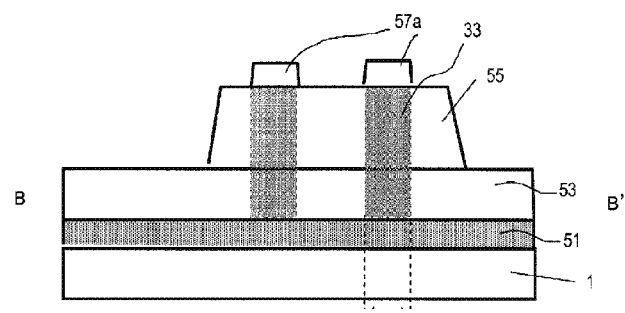

FIGS. 12a and 12b are a plan view and a cross-sectional view of the wiring cross portion 500 of the present embodiment, and FIGS. 13a and 13b are a plan view and a cross-sectional view that show an example of a conventional wiring cross portion.

As can be understood from FIG. 13, in conventional semiconductor devices, the portion of the upper wiring layer 57 that overlaps the lower wiring layer 51 is formed on the upper face of the upper insulating layer 55. In this example, the upper wiring layer 57 includes the first wiring line 57b that is formed on the upper face of the lower insulating layer 53 and the second wiring line 57a' that is formed on the upper face of the upper insulating layer 55. The widths of these wiring lines 57a and 57b are both decided by the resist pattern during etching. For this semiconductor device, in order to decrease the capacitance generated by the two wiring layers 51 and 57, it is preferable that a resist pattern be formed so as to decrease the width of the wiring line in the wiring cross portion, or in other words, the width of the second wiring line 57a'. The minimum width of the second wiring line 57a' is, for example, 3 μm, due to the limitations involved in the process. In this case, as shown in FIG. 13b, the width of the portion (the portion arranged between the lower wiring layer 51 and the upper wiring layer 57) 33 of the insulating layer 53 and 55 that forms the capacitance Cgd, is equal to the width of the second wiring line 57a' and the like, which is, for example, 3 μm. Furthermore, the thickness of this portion 33 is equal to the combined thickness of the lower insulating layer 53 and the upper insulating layer 55.

Figure 13C:
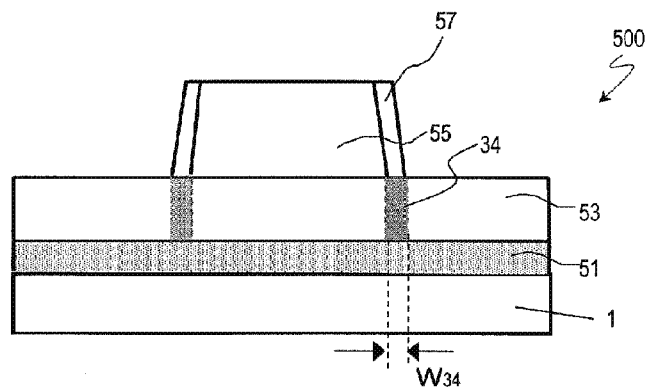
FIG. 13C is a cross-sectional view of the wiring cross portion of Embodiment 4.
Figure 14A:
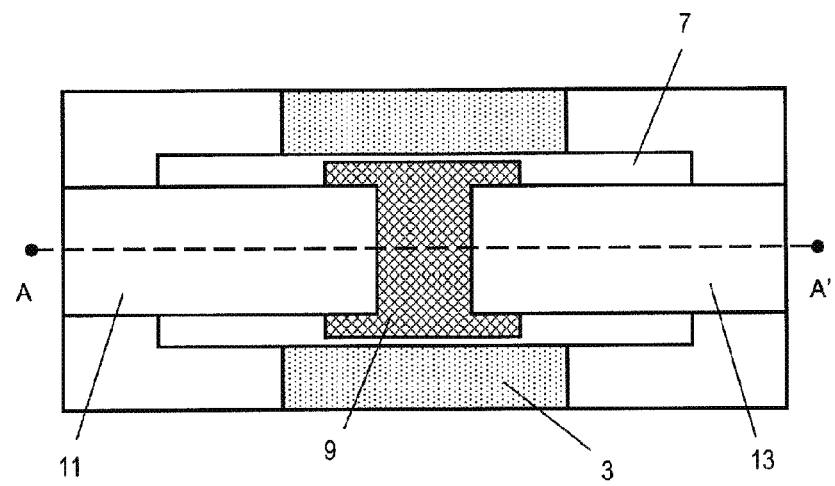
FIGS. 14A and 14B are, respectively, drawings that schematically show a conventional oxide semiconductor TFT.
Figure 14B:
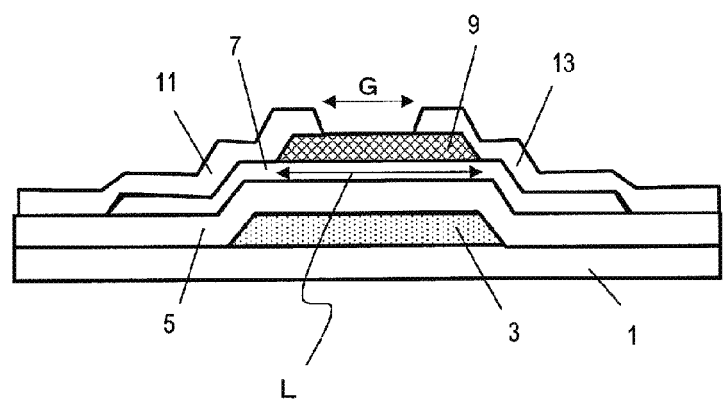

By contrast, according to the present embodiment, as shown in FIG. 13c, the width of the portion (the portion disposed between the lower wiring layer 51 and the upper wiring layer 57) 34 of the insulating layer 53 and 55 that forms the capacitance Cgd, has the same width as the second wiring line 57a, which is on the side walls of the upper insulating layer 55. This width is determined by the thickness of the conductive film for forming the upper wiring layer 57, and thus, can be reduced compared to the width that is determined by the limitation (minimum rule) in the above-mentioned process. Furthermore, the thickness of the portion 34 that forms the capacitance Cgd is equal to the thickness of the lower insulating layer 53. In this manner, compared to conventional semiconductor devices, it is possible to largely reduce the capacitance Cgd generated by the two wiring layers 51 and 57 intersecting with each other because it is possible to reduce the width of the upper wiring layer 57 of the wiring cross portion 500.

The semiconductor device for the present embodiment may be the semiconductor devices that were mentioned above with reference to FIGS. 11a to 11c. In this case, the structure of the wiring cross portion 500 of the present embodiment can be applied to at least one of the wiring cross portions included in these semiconductor devices. It is preferable that this structure be applied to places among the plurality of the wiring cross portions where relatively thin wiring lines can be used. In the case of a circuit shown in FIG. 11b, for example, this can be suitably applied to the wiring cross portion 89 of netA and the wiring line for inputting CKB.

INDUSTRIAL APPLICABILITY

The embodiments of the present invention can be widely applied to devices provided with: thin-film transistors such as circuit substrates including active matrix substrates; display devices including liquid crystal display devices, organic electroluminescent (EL) display devices, and inorganic electroluminescent display devices; imaging devices such as image sensor devices; and electronic devices such as image input devices and fingerprint readers.

DESCRIPTION OF REFERENCE CHARACTERS 1 substrate
3 gate
5 gate insulating film
7 oxide semiconductor layer (active layer)
7Ss, 7Sd side faces of an oxide semiconductor layer
9 protective layer
99 protective layer
9Ss, 9Sd side faces of protective layer
11 source electrode
11B source connecting member
13 drain electrode
13B drain connecting member
17, 19 resist pattern
100, 200, 300, 400 thin-film transistor
500 wiring cross portion

What is claimed is:
1. A semiconductor device, comprising:
a substrate;
a gate electrode provided on the substrate;
a first insulating layer formed on the gate electrode;
an island-shaped oxide semiconductor layer formed on the first insulating layer;
a source electrode electrically connected to the oxide semiconductor layer; and
a drain electrode electrically connected to the oxide semiconductor layer,
wherein the first insulating layer has a recess in the surface,
wherein the oxide semiconductor layer is formed on a bottom surface and side walls of said recess and on an upper face of the first insulating layer, and
wherein at least one of the source electrode and the drain electrode is disposed on a portion of the oxide semiconductor layer over the side walls of said recess, and is not formed on a portion of the oxide semiconductor layer over the upper face of the first insulating layer.
2. The semiconductor device according to claim 1, further comprising:
a lower wiring layer formed of the same conductive film as the gate electrode;

an upper wiring layer formed of the same conductive film as the source electrode, the upper wiring layer intersecting with the lower wiring layer across the first insulating layer to form a wiring cross portion; and an island-shaped second insulating layer formed of the same insulating film as the protective layer, wherein the upper wiring layer includes a first wiring line formed on the upper face of the first insulating layer, and a second wiring line disposed on the wiring cross portion and formed on the side walls of the second insulating layer, and wherein the upper wiring layer is not formed on the second insulating layer at the wiring cross portion.

3. The semiconductor device according to claim 1, wherein said oxide semiconductor layer includes an In—Ga—Zn—O semiconductor.

4. The semiconductor device according to claim 2, wherein said oxide semiconductor layer includes an In—Ga—Zn—O semiconductor.

* * * * *